(12) United States Patent
Petkie

(10) Patent No.: US 6,723,420 B2
(45) Date of Patent: Apr. 20, 2004

(54) THICK FILM PASTE SYSTEMS FOR CIRCUITS ON DIAMOND SUBSTRATES

(75) Inventor: Ronald R. Petkie, Macungie, PA (US)

(73) Assignee: Morgan Chemical Products, Inc., Allentown, PA (US)

( * ) Notice: Subject to any disclaimer, the term of this patent is extended or adjusted under 35 U.S.C. 154(b) by 0 days.

(21) Appl. No.: 10/119,073

(22) Filed: Apr. 9, 2002

(65) Prior Publication Data

US 2003/0035937 A1 Feb. 20, 2003

Related U.S. Application Data

(60) Provisional application No. 60/282,544, filed on Apr. 9, 2001.

(51) Int. Cl.$^7$ ................................................ B32B 15/00
(52) U.S. Cl. ..................... 428/210; 428/209; 428/432; 428/433; 428/689; 428/698; 428/702; 428/704; 428/434
(58) Field of Search ................. 428/210, 209, 428/432, 433–434, 689, 698, 702, 704

(56) References Cited

U.S. PATENT DOCUMENTS

| | | | |
|---|---|---|---|
| 4,639,391 A | 1/1987 | Kuo | |
| 4,985,377 A | 1/1991 | Iseki et al. | |
| 5,631,046 A | 5/1997 | Boudreaux et al. | |
| 5,637,261 A | 6/1997 | Mattox | |
| 5,853,888 A | 12/1998 | Dutta et al. | |
| 6,316,116 B1 * | 11/2001 | Nakamura et al. | 428/469 |

FOREIGN PATENT DOCUMENTS

| | | |
|---|---|---|
| EP | 0 306 271 A1 | 3/1989 |
| EP | 0 688 026 A1 | 12/1995 |
| WO | WO 98/42505 | 10/1998 |

OTHER PUBLICATIONS

Petkie, et al., "Packaging Aspects of CVD Diamond in High Performance Electronics Requiring Enhanced Thermal Management." *1998 International Symposium on Advanced Packaging Materials*, pp. 223–228 (Mar. 15, 1998).
International Search Report in related PCT/US02/11241, no date.
Weidner, et al., "Laser Induced Graphite Resistors in Synthetic Diamond," *Int'l. J. Microcircuits and Electronic Packaging*, 19(2):169 (1996).

* cited by examiner

*Primary Examiner*—Deborah Jones
*Assistant Examiner*—Ling Xu
(74) *Attorney, Agent, or Firm*—Dean W. Russell; Bruce D. Gray; Kilpatrick Stockton LLP

(57) ABSTRACT

This invention relates to the nature of thick film compositions that are specifically designed for the fabrication of circuit elements on diamond substrates, especially resistive elements. The nature of diamond sheet material requires special consideration because of its relatively low coefficient of thermal expansion and its sensitivity to oxygen at elevated processing temperatures. The general compositional requirements of thick film paste formulations are provided as a basis for accommodating the particular physical properties of diamond, and thereby establishing a method by which high performance microelectronic components can be fabricated economically. Thick film pastes containing certain borosilicate glasses, metal components, and optionally semiconducting materials are demonstrated to possess favorable behavior in terms of mechanical and electrical properties after sintering. Resistive elements on diamond can be fabricated by adding conductive components to a borosilicate glass.

34 Claims, 1 Drawing Sheet

THICK FILM PASTE SYSTEMS FOR CIRCUITS ON DIAMOND SUBSTRATES

This application claims benefit of the filing date of provisional U.S. Application Ser. No. 60/282,544, filed Apr. 9, 2001, the entire contents of which are incorporated herein by reference.

FIELD OF THE INVENTION

This invention relates to a method for the fabrication of thick film passive electrical components on diamond substrates for the microelectronics industry. More particularly, the method of this invention relates to depositing a thick film system of pastes onto diamond, and after firing, allowing the diamond to be incorporated into electronic packages using conventional joining techniques.

BACKGROUND OF THE INVENTION

Integration of high power electronic devices into electronic systems typically requires the construction of an electronic package comprised of active and passive components. Since the manufacturing costs for microelectronic parts must be low, inexpensive fabrication methods are required. Many microelectronic components are manufactured by the methods of thick film technology, which typically utilize screen-printing techniques to deposit a thick film paste in a pattern to define the circuit element. The printing is followed by a high temperature treatment, i.e. firing operation, in a belt furnace, at up to about 900° C., which sinters and stabilizes the paste components.

A passive circuit element consists of the passive material and a conductor material, which establishes its connection to the other elements of the circuit. Usually the conductor material is deposited and fired, followed next by the deposition and firing of the passive element material. An overcoat material may also be used to environmentally protect the passive material. In the case of a resistor element, for example, typically the conductor material is first printed and fired. The resistive material is then printed such that a portion of the printed resistive material is overlaid onto the terminating ends of the conductor, then fired. An overcoat, i.e. passivation layer, is printed over the resistive material and fired in a final step to environmentally protect the resistive material. Thus, the fabrication of a resistor element typically requires a series of three steps, each consisting of printing and firing of a thick film paste for the conductor, resistor, and overcoat. The sintering processes require a high temperature cycle, and each of the materials that comprise the parts of a resistor must, therefore, be compatible at these high temperatures during processing. A collection of compatible thick film pastes that are used in the fabrication of a particular circuit element is referred to as a "thick film paste system."

The choice of the substrate material used for the mechanical support of the circuit elements is dependent upon the application. In high performance circuits used in telecommunications networks, the requirements for operation at high power and at high frequencies are increasing. In such a case, the substrates must have relatively high thermal conductivity and excellent dielectric properties. Synthetic diamond such as chemical vapor deposited diamond ("CVD diamond") typically has a thermal conductivity that is many times greater than other conventional substrate materials currently used in the manufacture of thick film circuitry, such as aluminum oxide and beryllium oxide. Diamond also has a dielectric constant and loss tangent within the acceptable limits required for high frequency applications. Thus, diamond substrates have the potential to accommodate the demand for increasing power density and operational frequency requirements for high performance circuits.

High power devices, such as those used in high speed computing, microwave and RF telecommunications, typically use conventional ceramic materials such as beryllium oxide or aluminum nitride as substrates for thermal management. These materials are cut to shape from sheets and electronic circuits are fabricated onto the surfaces by the screen-printing methods discussed above. These conventional ceramic substrate materials are stable in the high-temperature oxygen-containing environment, e.g. air, required for sintering commercially available thick film pastes. Diamond, however, deteriorates at temperatures in excess of about 600° C. in air. At typical temperatures and times required for complete sintering of prior art thick film materials in air, a diamond substrate is disintegrated.

There are a variety of thick film pastes commercially available that are formulated for sintering in a non-oxidizing ambient, e.g. nitrogen. These pastes are in the minority of commercially available thick film systems for manufacturing circuit elements. Similarly, there are resistor formulations and passivation overcoats that may be fired in nitrogen. These thick film pastes usually contain a glass constituent that does not reduce in a non-oxidizing atmosphere and becomes fluidic at about 900° C. The glass wets to the substrate, resulting in a sintered microstructure that possesses robust adhesion and cohesion. Conductor and resistor thick film paste formulations are made by adding constituents that are more conductive than the glass, which lower the resistivity of the sintered structure to a desired specification. In these cases, the glass also wets to the additional constituent, retaining cohesion and adhesion. A commercially available thick film conductor paste based on a mixture of copper and glass powders, for example, has been formulated for firing in nitrogen at about 900° C.

In addition to the limited selection of thick film pastes, the chemistry of the constituents are generally designed for bonding to oxide substrates, such as beryllium oxide. This particular material has dominated the microelectronics market for thermal management applications because of its relatively high thermal conductivity compared to aluminum oxide, and relatively low cost. Beryllium oxide, however, is considered to be an environmentally unsafe material and will be phased out of usage in the near future. Alumina is inexpensive, but has a relatively low thermal conductivity, and is not used for high-performance thermal management applications.

Recently, as the manufacturing cost of diamond has declined due to improved CVD diamond synthesis techniques, the demand for diamond components has increased. The need for CVD diamond in high power density applications is rapidly increasing as package sizes decrease and package power increases. Sheets of diamond substrates have recently become commercially available with the lateral dimensions and flatness that are amenable to the screen-printing techniques discussed above. As a result, a thick film paste system for fabricating microelectronic circuits on the surface of diamond substrates, diamond heat spreaders and components would be useful in many applications where enhanced thermal management is vital to the performance of microelectronic packages. Therefore, there is a commercial need for improved thick film paste materials and manufacturing processes for application of these paste materials to enable the use of diamond substrates for high-power, high frequency electronic circuit elements.

To-date, techniques for production of reliable thick film structures on diamond for microelectronic packages using commercially available thick film pastes have not been known. Generally, thick film formulations that work well with oxide-based substrates do not work well for diamond substrates. These difficulties are generally due to one or more of four factors:

(1) the requirement to sinter the pastes in an oxygen-containing environment which is incompatible with diamond, (2) the lack of adhesion of available thick film formulations to diamond due to significant differences in the coefficient of thermal expansion (CTE) between diamond and constituents of most commercially available thick film pastes, which were originally developed for use on substrates with a significantly higher CTE that that of diamond, such as beryllium oxide or aluminum oxide, (3) the lack of adhesion of available thick film formulations to diamond due to the lack of chemical interaction or bonding, between diamond and the constituents in most commercially available thick film pastes, which were developed for oxide substrates, and/or (4) the lack of predictable resistance of conventional thick film paste materials (designed for oxide substrates) when applied to diamond substrates.

During attempts to formulate thick film resistor materials for diamond substrates, it was discovered that all commercially available thick film pastes that were tested failed to produce adequate adhesion, resistance, or temperature coefficient of resistance for use in commercial applications.

U.S. Pat. No. 4,639,391 and U.S. Pat. No. 4,985,377 teach barium or strontium borosilicate glass compositions and conductors in mixtures to obtain compositions exhibiting a wide range of resistances. There is no suggestion in either of these references of using diamond as a substrate material. Neither is there any suggestion of the entire thick film system (conductor, resistor, and passivation layers) that is required for the completion of a circuit element.

U.S. Pat. No. 5,631,046 refers to the metallization of diamond through the application of commercially available thick film pastes. A pre-treatment of the diamond in air at elevated temperature of 850° C. for 10 minutes is required for good adhesion. Such a treatment results in the deterioration of the thermal conductivity of the diamond by forming cavities on the surface. The cavities form as a result of preferential attack by oxygen on grain boundaries, which are inherent in polycrystalline diamond synthesized by common growth processes. Thus, this treatment is not practical without diminishing, to a considerable extent, the quality of the thermal performance originally intended of the diamond.

Graphite resistors are fabricated by laser ablation of the diamond surface as mentioned in a publication, Weidner et al., "Laser Induced Graphite Resistors in Synthetic Diamond", Int'l J. Microcircuits and Electronic Packaging, Feb. 2, 1996, p. 169. The temperature coefficient of resistance (TCR) for these resistors was not reported. This method of making resistors is inherently limited to low power applications. Since the resistor is formed from a graphite-like layer formed by laser machining, the resistive portion is essentially limited in thickness and the resistivity to narrow ranges, since the laser converts only a very thin amount of the diamond to a graphitic layer. The resistor, then, is limited to the electrical properties of graphite.

U.S. Pat. No. 5,853,888 refers to the surface modification of diamond to allow commercially available thick film pastes to adhere to the substrate. The modification consists of depositing thin films of chromium for adhesion, then aluminum oxide, followed by annealing in oxygen. Although this surface treatment results in a chemistry compatible with most commercially available thick film paste constituents, the additional cost of the surface treatment is high.

SUMMARY OF THE INVENTION

The invention relates to methods of applying (e.g., by painting or screen-printing) a thick film paste system onto the diamond surface to produce a diamond substrate having passive circuit elements. More specifically, the method allows for the fabrication of resistor elements having an sheet resistance of greater than about 1 ohm per square and a TCR within the range of about 0 to about ±300 ppm/°C. (ohm per square is a unit of an electrical measurement of surface resistivity across any given square area of a material; it is the measurement of the opposition to the movement of electrons across an area of a material's surface and normalized to a unit square, and is conventionally used in the art with respect to sheet resistance). Even more specifically, the method allows for the production of resistor elements having an sheet resistance of approximately 50 ohms per square, and a TCR between about −200 ppm/°C. and +200 ppm/°C.

The diamond substrate used in the product of this invention is preferably synthesized by chemical vapor deposition (CVD) methods. Typically, the diamond material is grown in flat sheets to a specified thickness, and then separated from the growth substrate. The diamond sheets may be polished to the required thickness and surface roughness while the opposing surfaces are kept parallel within the required specification or tolerances. Typical thickness of the diamond material is in the range of about 100 to 1000 micrometers, preferably about 300 to 500 micrometers. Typical average surface roughness of the diamond surface is 0.1 to 30 microns, depending on the frequency of the application. Laser machining can be performed, if necessary, prior to metallization in order to make via holes ("vias") in the diamond or to define the diamond surface dimensions.

Electronic packages made using the present invention take advantage of the heat spreading, thermal conductivity, and electrical insulating properties of CVD diamond. The products of this invention have applications including thermal management of high power, high frequency circuits used in communication networks and other electronic circuits, and are particularly useful in microwave communications devices, where small components capable of dissipating relatively large quantities of heat are desirable.

In accordance with this invention, glasses made of barium, boron, and silicon (barium borosilicate) have been found to provide particularly good adhesion to CVD diamond after being sintered at temperatures of up to about 900° C. In addition, it has been found that there is a class of resistor formulations based on essentially a barium borosilicate matrix that can be sintered in a non-oxidizing atmosphere.

In one embodiment, the invention relates to a method for producing circuit elements comprising:

(a) depositing onto a diamond or nitride substrate a patterned thick film resistive composition, said thick film composition comprising a borosilicate glass having one or more Group II metal oxides; and (b) firing said thick film resistive composition in an inert environment at a temperature and for a dwell time sufficient to form a resistive layer.

In another embodiment, the invention relates to methods that, in addition to the above steps, include (c) depositing a patterned layer of a thick film conductor paste onto at least a portion of the substrate; and (d) firing said thick film conductor paste in an inert environment at a temperature and for a dwell time sufficient to result in a patterned conducting thick film having a resistance of no greater than about 30 milliohms per square.

The conductive layer can be deposited onto the diamond substrate prior to deposition of the thick film resistive composition, or subsequently, so long as at least a portion of the layers overlap. A passivating dielectric layer can be deposited over the other layers and fired to protect the completed circuit element.

In another embodiment, the invention relates to a circuit element which comprises:

(a) a diamond or nitride substrate;

(b) a patterned conducting thick film layer; and (c) a patterned resistive thick film layer comprising a borosilicate glass containing one or more Group II metal oxides.

If desired, the resistive thick film layer can also contain quantities of conductive material to vary the sheet resistance of the layer. The conductive material can include metals, such as nickel, chromium, vanadium, zirconium, iron, hafnium, niobium, tantalum, tungsten, molybdenum, titanium, and mixtures and alloys thereof. In addition, if desired the resistive thick film layer can include quantities of materials capable of modifying the thermal coefficient of resistance. These can include semiconducting materials. Suitable TCR modifiers are those materials that can cause the TCR of the composition to vary, in particular those materials that have a negative TCR. TCR modifiers can include silicon, germanium, carbon, boron, semiconducting compounds, oxides, carbides, nitrides, ruthenates, and combinations thereof.

BRIEF DESCRIPTION OF THE DRAWINGS

Further features and advantages will become apparent from the following and more particular description of the preferred embodiment of the invention, as illustrated in the accompanying drawing in which.

DETAILED DESCRIPTION OF THE INVENTION

Figure 1:
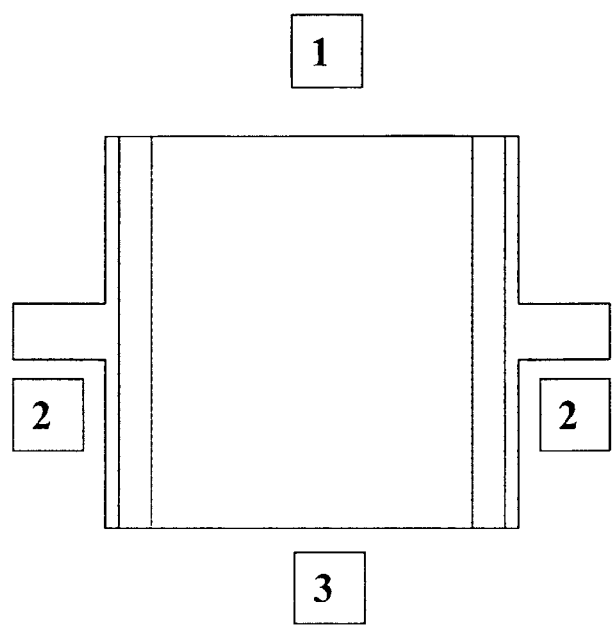
FIG. 1 is a diagrammatic top view of a typical square resistor element prepared in accordance with the method of the present invention.

U.S. Pat. Nos. 4,639,391 and 4,985,377, the entire contents of which are incorporated herein by reference, disclose types of borosilicate glasses suitable for use in thick film resistors. The inventors have found that some of these types of borosilicate glass formulations (i.e., borosilicate glasses containing alkaline earth metal oxides, such as barium oxide and strontium oxide) are particularly effective at providing good adhesion to diamond. Ranges for the major components of these types of glasses, in weight percent, are presented in Table 1. The Other Oxides in the composition of Glass #3 include oxides of titanium, zirconium, tantalum, calcium, magnesium, niobium and vanadium, which are used as TCR modifiers.

TABLE 1

| | Compositions of Glasses | | | | | | |
|---|---|---|---|---|---|---|---|
| Glass Material | Si Dioxide Wt. % | Ba Oxide Wt. % | Boron Oxide Wt. % | Cu Oxide Wt. % | Sr Oxide Wt. % | Al Oxide Wt. % | Other Oxides Wt. % |
| Glass #1 | 5–10 | 30–50 | 40–60 | 1.5 | | | |
| Glass #2 | 2–10 | | 50–70 | | 25-45 | | |
| Glass #3 (average) | 9 | 36 | 36 | | | 5 | 14 |

The thick film resistor formulations discussed in both cited patents can be characterized as a borosilicate glass mixed with semi-conducting components. The semi-conducting components are primarily composed of silicides and borides of refractory elements, especially those of titanium and tantalum. The '377 patent teaches the use of a combination of suicides, borides, and other additives, while the '391 patent gives examples of formulations using only two suicides. The resistivity and TCR of the resistor is controlled by ratios of the semi-conducting, oxides, and glass constituents. The resistance and TCR are given for specific ratios, so it is possible to select a desired composition range for a specific application, such as high frequency circuit elements.

The fundamental glass components that play a role in adhesion, especially to diamond, are the oxides boron and silicon coupled with either of the Group II elements, barium or strontium, resulting in a borosilicate glass. Strontium and boron borosilicate glasses are chemically similar and have comparable melting temperatures when made in a similar fashion. What is not taught or suggested in the cited patents, and what forms an important feature of this invention is the discovery that certain glass formulations having resistance and TCR properties suitable for use in passive circuit elements have surprisingly good adhesion to diamond, making their use desirable in high frequency circuit elements.

In the Examples set forth below, it has been demonstrated that good adhesion to diamond was achieved with a resistor material containing a barium borosilicate glass, and excellent adhesion was achieved with a resistor material containing a strontium borosilicate glass. Borosilicate glasses are suitable as the basis of a thick film system for diamond substrates because of their wettability to diamond during the sintering operation. The borosilicate glass should also have a softening point of about 650° C. to 700° C., so that the glass becomes fluidic at about 850° C. to 900° C., which is the normal firing temperature range for most thick film pastes. Such temperatures are desirable to sinter the components together, wet to the diamond, and form the reactants within a relatively short time (within 30 minutes or less), resulting in a thick film that is adhesive and cohesive. Boron oxide can be a major constituent of the glass, and can provide for a lower softening point glass, since boron oxide has a melting temperature of 450° C. Aluminum oxide may be used to adjust the resistance and TCR of the resistor thick film paste. Thus, certain borosilicate glasses form the basis for a thick film system for diamond by virtue of the compatible physical properties specifically required for diamond, which has not been previously considered in the prior art.

EXAMPLES

In the Examples below, thick film resistor compositions were prepared by mixing various combinations of borosilicate glasses, metals, semiconducting components and a commercially available vehicle (for proper Theological properties and nitrogen compatibility). After application of the pastes onto the CVD diamond substrates and firing at 900° C. in nitrogen, the adhesion and cohesion, sheet resistance and TCR of the fired pastes were evaluated.

Example 1

This Example illustrates the general method for deposition of passive circuit elements on diamond. The following is a summary of the method used for fabricating Resistor Paste Formulas 1–3 in Table 2.

Step 1: A layer of commercially available thick film conductor, i.e. metal paste (Dupont 9924M) was deposited onto small CVD diamond substrates by painting. The small substrates had dimensions typically about 0.12 inch by 0.5 inch by 300 microns in thickness. Screen printing was used to deposit the same thick film conductor paste onto larger substrates, of size about 1 inch by 1 inch by 300 microns in thickness.

Step 2: The conductor paste was fired at about 900° C. with a dwell time of about 10 minutes in a nitrogen ambient. The portions of resistor element 1 present after step 2 were terminals 2 shown in FIG. 1. The fired thickness of this layer ranged from about 3 microns to about 25 microns. Generally, the fired thickness of the thick film conductor paste should be in the range of about 5 to 30 microns, preferably about 12 to 25 microns.

Step 3: A thick film resistor composition, as given in Table 2, comprising a borosilicate glass and other components, was deposited onto the exposed diamond surface and a portion of conductor terminals 1 by painting or screen printing.

Step 4: The thick film resistor composition was fired at about 900° C. with a dwell time of 10 to 30 minutes in a nitrogen ambient. The portion of the resistor element present after step 4 was resistive element 3 shown in FIG. 1. The resistive portion that was overlaid onto the conductive portion deposited after step 1 is shown on the left and right side of resistor element 1 adjacent terminals 2. The fired thickness of the resistive film also ranged from about 3 microns to about 50 microns.

Step 5: A commercially available passivation dielectric composition (Heraeus IP7098) was deposited onto resistor element 1 by painting. This step can also be done by screen-printing.

Step 6: The dielectric paste was fired at about 750° C. with a dwell time of 10 minutes in a nitrogen ambient.

The thick film Resistor Paste Formulas consisted of variations of a commercially available barium borosilicate glass (Glass #4) and two forms of titanium silicide, $TiSi_2$ and $Ti_5Si_3$. In Resistor Paste Formula 3, copper oxide was added to Glass #4 to yield a glass that contained 1.5 wt. % CuO. The composition of Glass #4 by weight percent was 45% barium oxide, 35% boron oxide, 3% aluminum oxide and 17% silicon dioxide. Table 2 below indicates the results for three of the compositions prepared in accordance with the method set forth in the Example below. In Table 2, Boride A was a mixture of 38 wt. % titanium boride and 62% zirconium boride.

TABLE 2

Borosilicate Glass + Silicide or Boride Thick Film Resistors

| Resistor Paste Formula | Glass #4 Wt. % | Copper Oxide Wt. % | $TiSi_2$ Wt. % | $Ti_5Si_3$ Wt. % | $TaSi_2$ Wt. % | Boride A Wt. % | Post-firing Sheet Resistance (ohms/square) |
|---|---|---|---|---|---|---|---|
| 1 | 39.4 | — | — | — | 31.6 | 29 | 334 |
| 2 | 70 | — | 20 | 10 | — | — | 840 |
| 3 | 69 | 1 | 20 | 10 | — | — | 3500 |

The adhesion of the post-fired thick film resistors made from Formulas 1, 2 and 3 was moderately good, with some brittleness.

Thick film compositions were also tested using the average compositions given above for Glass #1 and #2. It is preferred that a powdered glass is first made by melting the oxides together at elevated temperatures, ball milling to a powder until a particle size of less than about 10 microns is attained, then combining the glass with the conducting constituents to make a homogeneous powder. In this case, however, thick film pastes of the resistor formulas of Example 1 were made by first mixing the oxides powders in the weight percents as listed in Table 2 for the average compositions of Glass #1 and Glass #2. The semiconducting constituents (silicides and borides) were added at weight percents believed to be sufficient, along with an organic rheological vehicle for nitrogen thick film paste and a thinner to adjust the rheology of the paste. The pastes were painted onto substrates of diamond and fired in nitrogen at 900° C. as indicated above. Although the pastes consisted of oxides, rather than glasses made from the oxides, the sintered films had relatively good adhesion and cohesion in most cases. These results suggest that paste compositions based on the borosilicate glass, rather than its oxide precursors, would result in very favorable behavior in terms of adhesion and cohesion.

The results in Table 2 show that it was possible to produce thick film resistors on diamond, having sheet resistance in the range of about 330 to 3,500 ohms per square. Using the components listed in Table 2, it was not possible to produce thick film resistors on diamond having a sheet resistance of approximately 50 ohms per square and TCR in the range of −200 ppm/° C. to +200 ppm/° C.

Example 2

This Example illustrates a method for deposition of thick film resistors on diamond that exhibit lower sheet resistance and TCR than those produced in Example 1. The method used to fabricate thick film resistors in this Example was similar to that used in Example 1, except that the Resistor Paste Formulas consisted of the compositions summarized in Table 3 and were applied to the diamond substrate and fired prior to application and firing of the conductive material. The conductive material used in Example 1 was then painted or screen printed and fired as described in Example 1. The thick film Resistor Paste Formulas consisted of strontium borosilicate glass (Glass #5) within the range given for Glass #2 in Table 1. Nichrome alloy or nickel and chromium metal powders were added to Glass #5 to obtain a resistance in the desired range of approximately 50 ohms per square, and a small fraction of silicon was added to adjust the TCR to obtain a value less than 200 ppm/° C. The Resistor Paste Formulations and the results achieved are presented in Table 3.

After printing the paste, drying, and sintering at 900 ° C., the thick films were approximately 10–15 microns. The adhesion and cohesion of the nichrome-strontium borosilicate thick film was found to be excellent and essentially without brittleness.

2. The mixed powder was placed in an agate mortar and ground with an agate pestle for several minutes to remove any small aggregates of the powders and to increase the homogeneity.
3. The ground powder was immersed in acetone such that the particles could be further homogenized by ultrasonic agitation.
4. The acetone was evaporated away from the powder.
5. The powder was ground once again to break it up after the drying process.

The resistor paste was made by combining the powder with a commercially available organic vehicle and thinner that are specifically suitable for nitrogen gas ambients during firing. The weight percent of the vehicle was generally 29% of the weight of the powder and thinner was then added to adjust the rheological properties of the final paste. This mixture was blended using a metal spatula for a few minutes until the powder was thoroughly wetted by the organic components and the paste could be screen-printed. In Examples 1 and 2, it is demonstrated that borosilicate glass provided good to excellent adhesion of the thick film paste resistor to the diamond substrate. While silicides and borides are good candidates for the semi-conducting constituent in resistor compositions because of the available ranges of resistance and TCR (see Example 1), it was unexpectedly found in Example 2 that the combination of a borosilicate glass and Nichrome, a metal alloy, or nickel and chromium metal powders, enabled the production of a resistor with a sheet resistance in the range of 50 ohms per square with a thickness between 10 and 15 microns. It was also found that addition of a small amount of silicon to the formulation unexpectedly resulted in extremely low TCR

TABLE 3

Borosilicate Glass + NiChrome + Silicon Thick Film Resistors

| Resistor Paste Formula | Glass #5 Wt. % | Nichrome Alloy Wt. % | Si Wt. % | Ni Wt. % | Cr Wt. % | Post-firing Average Sheet Resistance (ohms/square) | Post-firing Average TCR (ppm/° C.) |
|---|---|---|---|---|---|---|---|
| 4 | 60.18 | 0 | 0 | 31.86 | 7.96 | 4.7 | 1000 |
| 5 | 64.02 | 34.99 | 0.99 | 0 | 0 | 30 | 85 |
| 6 | 66.59 | 32.48 | 0.93 | 0 | 0 | 70 | 96 |

The composition of Glass #5 by weight percent was 60% boron oxide, 35% strontium oxide, and 5% silicon dioxide. Glass #5 was ball-milled until the mean particle size was about 3 microns (50% of the particles are less than 2.89 microns). The physical properties of this glass are as follows:

Density=3.18g/cc$^3$

Softening Point=707° C.

CTE=7.75ppm/° C.

The nichrome alloy consisted of 80% nickel and 20% chromium by weight as purchased from Alfa Aesar at a mesh size of 325 (45 micron particle size). The nichrome powder was further ball-milled to obtain a smaller average particle size, which was determined to be about 24 microns.

The Resistor Paste Formulations were fabricated as follows:

1. The proper weight percentages of Glass #5 and nichrome powders (or elemental nickel and chromium powders) were thoroughly mixed in the dry state.

values of less than 200 ppm/° C. Note that in Table 3, the absence of silicon, Resistor Paste Formula #4 produced a high positive-value TCR. It was found that by increasing the weight percent of silicon, the TCR decreased from high positive values to negative values, as in Resistor Paste Formulae #5 and #6.

Without wishing to be bound by any theory, it is believed at this point that the use of pure metals or alloy components, rather than silicide or boride compounds, permits the use of a smaller amount of the conductive components in the composition. This result is believed to be due to the higher conductivity of pure metals or alloys as compared to the relatively lower conductivity of silicides and borides. A lower amount of the more typical conductive components allows the borosilicate glass to wet to the diamond substrate, while, in general, none of the conductive constituents, i.e., metals, silicides, or borides, melt at the firing temperatures, and therefore do not wet to the diamond surface. It is generally true that as the weight percent of the conductive components is increased, the adhesion to the substrate decreases, eventually resulting in unacceptable adhesion.

Conversely, adhesion can improve as the weight percent of glass increases, but the conductance decreases. In addition, some metals are carbide formers, even in the presence of nitrogen, which is the gaseous ambient typically used in the sintering of thick films. This carbide-forming property can introduce a chemical adhesion component to the overall adhesion between the sintered thick film and the diamond substrate.

Within the scope of the present invention, it is believed that it is possible to achieve a desired range of sheet resistance and TCR by the addition of appropriate quantities of other metal (or alloy) constituents, such as chromium, vanadium, zirconium, iron, hafnium, niobium, tantalum, tungsten, molybdenum, titanium, etc. to the borosilicate glass. It is anticipated that the only limitations in the selection of a metal constituent(s) are that it wets to the borosilicate glass and preferably, but not necessarily, forms a carbide and does not readily form a nitride.

The preference of the metal being a carbide former is to promote chemical adhesion to the diamond substrate. The preference for the metal constituent(s) to be a non-nitride former(s) is for compatibility with nitrogen ambient during firing. If argon were used instead of nitrogen, this preference is unnecessary.

It is also preferable, but not necessary, that the metals form a silicide since the metal silicide may contribute to control the TCR. Most metals readily form silicides, since silicon is very reactive, especially at elevated temperatures. The weight ratio of the metal to glass can be used to obtain the desired resistance, while additions of one or more semiconducting components, such as silicon, germanium, or semiconducting compounds, can be used in relatively very small quantities to control the TCR. This condition is ideal, since very small additions do not modify the adhesion (mechanical property) of the material, while the TCR (electrical property) can be controlled by essentially 'doping' the composition.

The ranges of the weight ratios are limited only by the condition that the sintered thick film retains the ability to wet to the diamond and form a cohesive thick film after sintering. It is anticipated that once the metal component exceeds about 70 wt %, then adhesion to the diamond may be reduced below acceptable limits unless the metal is a strong carbide former. At this percentage of metal, the resistor values formed by normal screen printing techniques will be very small. It is estimated that if the metal component is less about 15 wt %, then the metal particles may not be able to form a conductive network, and the resistance of the film will be based entirely upon the glass. The weight percent of the TCR modifier is anticipated to range from fractions of a percent (e.g., about 0.5 wt % to about 10 wt %, depending on the electrical properties of the modifier and the reaction with the metal and glass. The particle size of the metal and TCR modifier constituents may effect these amounts. All percentages are by weight based on the total resistive layer composition.

It is believed that the metal (nichrome), a semiconducting component (silicon), and the borosilicate glass (strontium borosilicate), when combined in the proper weight ratios, form a matrix upon sintering that contains a combination of metal and semiconducting elements within the sintered matrix. The semiconducting components and glasses generally have a negative TCR, while metals have a positive TCR. Thus, when combined in the proper ratios, a sheet resistance of around 50 ohms/square can be obtained by controlling the amount of the metal constituent, while the positive TCR of this dominant conductive constituent can be balanced by the negative TCR of the semiconducting constituent to yield a TCR less than 200 ppm/° C., or even near 0 ppm/° C., which is desirable for high performance applications. Carbon, germanium, and boron are suitable TCR modifiers, as are carbides, nitrides, oxides, and ruthenates, including, but not limited to, silicon carbide, chromium carbide, tantalum nitride, silicon nitride, niobium oxide, silicon monoxide, tantalum oxide, niobium oxide, strontium ruthenate.

Based on the above disclosure, a circuit element such as a resistor can be formulated by adjusting the amount and type of the conducting and semi-conducting constituents, and evaluating the resulting properties. A resistor of 50 ohms per square sheet resistance having a TCR between about −200 ppm/° C. and +200 ppm/° C., for example, can be fabricated on diamond by using the appropriate ratios of semi-conducting and borosilicate glass constituents. The ranges for the weight percent of metal are 30–35% for a 50 ohm resistor. Using silicon as a TCR modifier, weight percents of 0.5–1.5% should be sufficient to obtain a near 0 ppm TCR. As the silicon percent is increased, the TCR decreases from a positive value to a negative value. In most cases, an sheet resistance of greater than about 1 ohm per square and a TCR within the range of about 0 to about ±300 ppm/° C. is suitable for applications intended for the product from the method of the present invention.

The sheet resistance is determined by the intrinsic resistivity of the fired paste and the thickness of the resistive element. In order to maintain a constant value of sheet resistance, any increase in the intrinsic resistivity should be accompanied by a proportional increase in thickness of the resistive element. The sheet resistance in this formulation is inversely related to the weight percent of the metal component(s). The TCR modifier can be adjusted in amount to attain a TCR near 0 ppm/° C. for any adjustment in the weight percent of the metal constituent(s). Because the sheet resistance can be made to vary rather widely by varying the intrinsic resistivity of the fired paste, the thickness of the resistive element can also be made to vary in order to achieve to specific sheet resistance.

In the practice of screen printing, the thickness of the resistive element can be decreased by decreasing the emulsion thickness of the screen. If a given paste formulation were made to be more conductive by increasing the weight percent of the metal component(s), then in order to achieve the same sheet resistance in a resistive element, the thickness of the resistive element must be decreased in accordance with the decrease in the resistivity of the thick film. Thus, the flexibility in the formulation of the paste constituents allows flexibility in the thickness of the resistive element, which is important in achieving efficient thermal management. For example, thick film resistive elements typically have a minimum thickness of about 10 microns. This thickness can be decreased to lower values in order to improve the thermal management and make maximum use of the thermal conductivity of the diamond, since the thermal transfer improves as the resistive element is brought into a closer proximity to the diamond surface. The lower limit in thickness can be determined from the maximum allowable current density in the resistive element and the ability to sinter the components of the paste in order to achieve reproducible results in adhesion and cohesion. The sintering properties of the paste partially depend, in turn, on the particle size of the constituents. Lower limits in the thickness can be achieved by decreasing the particle sizes of the constituents.

It should also be noted that the Resistor Paste Formulae may also be used to fabricate resistors on aluminum nitride, which is also relatively inert substrate material compared to the oxide substrates.

It is also possible that thick film capacitors and inductors could also be fabricated by the process of the present invention using the borosilicate glass as the basis for adhesion and cohesion of other constituents in portions of circuit elements.

From the foregoing description, one of ordinary skill in the art can easily ascertain that the present invention provides an improved method for producing a wide variety of circuit elements, especially resistor elements for high power, high frequency circuits used in communication networks and other electronic circuits.

Without departing from the spirit and scope of this invention, one of ordinary skill in the art can make various changes and modifications to the invention to adapt it to various usages and conditions. As such, these changes and modifications are properly, equitably, and intended to be, within the full range of equivalents of the following claims.

What is claimed is:

1. A circuit element which comprises;
   (a) a diamond substrate:
   (b) a patterned conducting thick film layer disposed between at least a portion of the patterned resistive thick film and at least a portion of the diamond substrate; and
   (c) a patterned resistive thick film layer comprising a borosilicate glass containing one or more Group II metal oxides.

2. The circuit element of claim 1, having an sheet resistance of greater than about 1 ohm per square and a thermal coefficient of resistance within the range of about 0 to about ±300 ppm/° C.

3. The circuit element of claim 1, wherein the patterned resistive thick film layer further comprises one or more conductive materials.

4. The circuit element of claim 3, wherein the conductive materials comprise one or more metals selected from the group consisting of nickel, chromium, vanadium, zirconium, iron, hafnium, niobium, tantalum, tungsten, molybdenum, titanium, and mixtures and alloys thereof.

5. The circuit element of claim 3, wherein the conductive material is present in a weight ratio ranging from about 15 wt % to about 70 wt % based on the total composition.

6. The circuit element of claim 1, wherein the patterned resistive thick film layer further comprises one or more thermal coefficient of resistance modifying materials.

7. The circuit element of claim 6, wherein the thermal coefficient of resistance modifying material is selected from the group consisting of silicon, germanium, semiconducting compounds, and combinations and mixtures thereof.

8. The circuit element of claim 6, wherein the thermal coefficient of resistance modifying material is selected from the group consisting of carbides, oxides, nitrides, ruthenates, and mixtures thereof.

9. The circuit element of claim 6, wherein the thermal coefficient of resistance modifying materials are present in a weight ratio ranging from about 0.5% to about 10% based on total composition.

10. The circuit element of claim 1, further comprising a passivating dielectric thick film layer disposed on at least a portion of the patterned resistive thick film layer.

11. The circuit element of claim 1, having an sheet resistance of about 50 ohms per square and a thermal coefficient of resistance of less than about 200 ppm/° C.

12. The circuit element of claim 1, wherein the thermal coefficient of resistance is about 0 ppm/° C.

13. A circuit element which comprises:
    (a) a diamond substrate;
    (b) a patterned conducting thick film layer; and
    (c) a patterned resistive thick film layer comprising a borosilicate glass containing one or more Group II metal oxides, wherein the patterned resistive thick film layer is disposed between at least a portion of the patterned conducting thick film and at least a portion of the diamond substrate.

14. The circuit element of claim 13, having an sheet resistance of greater than about 1 ohm per square and a thermal coefficient of resistance within the range of about 0 to about ±300 ppm/° C.

15. The circuit element of claim 13, wherein the patterned resistive thick film layer further comprises one or more conductive materials.

16. The circuit element of claim 15, wherein the conductive materials comprise one or more metals selected from the group consisting of nickel, chromium, vanadium, zirconium, iron, hafnium, niobium, tantalum, tungsten, molybdenum, titanium, and mixtures and alloys thereof.

17. The circuit element of claim 15, wherein the conductive material is present in a weight ratio ranging from about 15 wt % to about 70 wt % based on the total composition.

18. The circuit element of claim 13, wherein the patterned resistive thick film layer further comprises one or more thermal coefficient of resistance modifying materials.

19. The circuit element of claim 18, wherein the thermal coefficient of resistance modifying material is selected from the group consisting of silicon, germanium, semiconducting compounds, and combinations and mixtures thereof.

20. The circuit element of claim 18, wherein the thermal coefficient of resistance modifying material is selected from the group consisting of carbides, oxides, nitrides, ruthenates, and mixtures thereof.

21. The circuit element of claim 18, wherein the thermal coefficient of resistance modifying materials are present in a weight ratio ranging from about 0.5% to about 10% based on total composition.

22. The circuit element of claim 13, further comprising a passivating dielectric thick film layer disposed on at least a portion of the patterned resistive thick film layer.

23. The circuit element of claim 13, having an sheet resistance of about 50 ohms per square and a thermal coefficient of resistance of less than about 200 ppm/° C.

24. The circuit element of claim 13, wherein the thermal coefficient of resistance is about 0 ppm/° C.

25. A circuit element which comprises:
    (a) a diamond or nitride substrate;
    (b) a patterned conducting thick film layer; and
    (c) a patterned resistive thick film layer comprising
        (i) a borosilicate glass containing one or more Group II metal oxides and
        (ii) one or more conductive materials comprising one or more metals selected from the group consisting of nickel, chromium, vanadium, zirconium, iron, hafnium, niobium, tantalum, tungsten, molybdenum, titanium, and mixtures and alloys thereof.

26. The circuit element of claim 25, wherein the conductive material is present in a weight ratio ranging from about 15 wt % to about 70 wt % based on the total composition.

27. The circuit element of claim 25, wherein the patterned resistive thick film layer further comprises one or more thermal coefficient of resistance modifying materials.

28. The circuit element of claim 27, wherein the thermal coefficient of resistance modifying material is selected from the group consisting of silicon, germanium, semiconducting compounds, and combinations and mixtures thereof.

29. The circuit element of claim 27, wherein the thermal coefficient of resistance modifying material is selected from the group consisting of carbides, oxides, nitrides, ruthenates, and mixtures thereof.

30. The circuit element of claim 27, wherein the thermal coefficient of resistance modifying materials are present in a weight ratio ranging from about 0.5% to about 10% based on total composition.

31. The circuit element of claim 25, further comprising a passivating dielectric thick film layer disposed on at least a portion of the patterned resistive thick film layer.

32. The circuit element of claim 25 having an sheet resistance of about 50 ohms per square and a thermal coefficient of resistance of less than about 200 ppm/° C.

33. The circuit element of claim 32, wherein The thermal coefficient of resistance is about 0 ppm/° C.

34. The circuit element of claim 25, having an sheet resistance of greater than about 1 ohm per square and a thermal coefficient of resistance within the range of about 0 to ±300 ppm/° C.

* * * * *